United States Patent
Saint-Patrice et al.

(10) Patent No.: US 8,482,130 B2
(45) Date of Patent: Jul. 9, 2013

(54) INTERCONNECT STRUCTURE COMPRISING BLIND VIAS INTENDED TO BE METALIZED

(75) Inventors: Damien Saint-Patrice, Chabeuil (FR); Sebastien Bolis, Crolles (FR); Fabrice Jacquet, St Pierre de Mesage (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 28 days.

(21) Appl. No.: 13/031,917

(22) Filed: Feb. 22, 2011

(65) Prior Publication Data

US 2011/0221068 A1   Sep. 15, 2011

(30) Foreign Application Priority Data

Mar. 10, 2010 (FR) .................................. 10 51727

(51) Int. Cl.
*H01L 23/48* (2006.01)
*H01L 21/768* (2006.01)
(52) U.S. Cl.
USPC ............ 257/774; 257/E23.067; 257/E21.499; 257/E21.585; 257/E23.141; 257/773; 257/777; 257/432; 257/585
(58) Field of Classification Search
USPC .................. 257/774, 773, E23.068, E21.499, 257/E21.585, 432, 777, E23.141
See application file for complete search history.

(56) References Cited

U.S. PATENT DOCUMENTS

| | | | |
|---|---|---|---|
| 2006/0148250 A1 | 7/2006 | Kirby | |
| 2006/0205211 A1 | 9/2006 | Kirby | |
| 2007/0139977 A1* | 6/2007 | Desai et al. | 363/27 |
| 2007/0257373 A1* | 11/2007 | Akram et al. | 257/774 |
| 2008/0277258 A1* | 11/2008 | Foster et al. | 200/512 |
| 2009/0008780 A1* | 1/2009 | Kirby | 257/751 |
| 2009/0146312 A1* | 6/2009 | Sulfridge | 257/774 |
| 2009/0179017 A1* | 7/2009 | Matsumoto et al. | 219/121.71 |
| 2010/0096759 A1* | 4/2010 | Kirby et al. | 257/774 |
| 2010/0244272 A1* | 9/2010 | Lee et al. | 257/773 |
| 2011/0133302 A1* | 6/2011 | Sulfridge | 257/466 |

FOREIGN PATENT DOCUMENTS

| | | |
|---|---|---|
| JP | 2002-144523 A | 5/2002 |
| JP | 2003-124380 A | 4/2003 |

OTHER PUBLICATIONS

U.S. Appl. No. 13/039,902, filed Mar. 3, 2011, Jacquet, et al.
French Preliminary Search Report issued on Oct. 26, 2010 in corresponding French Application No. 1051727 (with an English Translation of Catergories).
U.S. Appl. No. 12/912,203, filed Oct. 26, 2010, Bolis, et al.

* cited by examiner

*Primary Examiner* — A O Williams
(74) *Attorney, Agent, or Firm* — Oblon, Spivak, McClelland, Maier & Neustadt, L.L.P.

(57) ABSTRACT

An interconnect structure including:
- at least one first substrate, whereof at least one first face is made integral with at least one face of at least one second substrate,
- at least one blind via passing through the first substrate and emerging at the first face of the first substrate and at a second face, opposite the first face, of the first substrate,
- at least one electric contact arranged against said face of the second substrate and opposite the blind via, and/or against the first face and/or against the second face of the first substrate,
- at least one channel putting the blind via in communication with an environment outside the interconnect structure and/or with at least one cavity formed in the interconnect structure, and extending substantially parallel to one of said faces of the first or second substrate.

11 Claims, 6 Drawing Sheets

INTERCONNECT STRUCTURE COMPRISING BLIND VIAS INTENDED TO BE METALIZED

TECHNICAL FIELD

The invention relates to the field of microelectronic devices comprising one or several blind vias to be metalized.

The invention more particularly concerns an interconnect structure including several blind vias intended to be metalized, for example during a same metallization step.

The invention may be used in microelectronics to produce electric interconnects and/or electric contact pick-ups in an interconnect structure comprising a microelectronic substrate or wafer, i.e. serving as medium for making one or several electronic circuits electrically connected to the interconnects and/or the electric circuits.

The invention is particularly suitable for making one or several electric interconnects between two substrates by metalizing one or several blind vias formed in at least one of the two substrates, or for making an electric contact pick-up in a microelectronic device such as an imaging device.

BACKGROUND OF THE INVENTION

It is known to make electric interconnects or electric contact pick-ups in a substrate by forming vias, i.e. holes or cavities, in that substrate, then by metalizing said vias, i.e. filling them with an electrically conducting material, such as metal.

Such metallization of the vias formed in a substrate can be obtained by using traditional vacuum deposition methods, e.g. PVD (physical vapor deposition), PECVD (plasma-enhanced chemical vapor deposition), electrolysis, etc. These methods are suitable for metalizing vias with small diameters, for example smaller than about 100 µm, and small depths.

However, these methods become unsuitable when one wishes to metalize vias with larger depths, for example in the case of through vias formed in the entire thickness of a semi-conducting substrate such as silicon, the standard thickness of which is equal to about 720 µm, and even for vias having patterns with large dimensions, i.e. having a diameter greater than or equal to about 200 µm, due to the extremely long implementation times needed, and therefore the cost of performing such metallizations.

In order to reduce this cost, it is also known to metalize vias using serigraphy: the electrically conducting material is arranged on the substrate in the form of a paste then, via a doctor blade, said paste is introduced into the vias.

However, such metallization by serigraphy poses problems in the cases of so-called "blind" vias, i.e. non-through vias that emerge on a single face of the substrate and have a bottom wall formed either in the substrate or by a second substrate made integral with the first substrate. The most frequent flaws then encountered are the capture of air bubbles in the vias, under the electrically conducting material, and/or partial filling of the vias preventing picking up of the electric contacts formed by the vias on the side of the bottom walls of the vias.

To offset these problems, document JP 2002/144523 A proposes metalizing vias by carrying out vacuum serigraphy. However, there are many drawbacks related to carrying out such vacuum serigraphy:

the modifications that must be made to the serigraphy equipment to perform such vacuum serigraphy are very expensive, the time necessary to place the substrate under vacuum before proceeding with the serigraphy is significant, the serigraphy material used to metalize the vias must be compatible with placement under vacuum, which requires the use of a polymer/metal composite as metallization material, the quality of the electric interconnect obtained for example between the serigraphed metallization material and the electrically conducting walls of the via is random.

BRIEF DESCRIPTION OF THE INVENTION

Thus there is a need to propose an interconnect structure comprising one or several blind vias, i.e. one or several vias passing through at least a first substrate of the interconnect structure and whereof the bottom wall(s) is(are) formed by at least one second substrate made integral with the first substrate, able to be metalized using traditional metallization techniques while also doing away with the metallization flaws encountered in the prior art, i.e. the capture of air bubbles in the vias, under the metallization material, and/or partial filling of the vias by the metallization material.

To that end, one embodiment of the present invention proposes an interconnect structure including:

at least one first substrate, whereof at least one first face is made integral with at least one face of at least one second substrate, at least one blind via passing through the first substrate and emerging at the first face of the first substrate and at a second face, opposite the first face, of the first substrate, at least one electric contact arranged against said face of the second substrate and opposite the blind via, and/or against the first face and/or against the second face of the first substrate, at least one channel putting the blind via in communication with an environment outside the interconnect structure and/or with at least one cavity formed in the interconnect structure.

At least part of the channel extends substantially parallel to at least one of said faces of the first and/or second substrate, i.e. parallel to the first face and/or the second face of said the first substrate, and/or parallel to said face of the second substrate.

The blind via to be metalized of the interconnect structure includes an opening on the side of the second face of the first substrate making it possible to introduce a metallization material into the via. The channel emerges in the blind via, allowing air, or more generally a fluid, to circulate between the blind via and the outside environment and/or a cavity. Thus, when the metallization material is introduced into the blind via, the air or fluid present under the metallization material can therefore either escape outside the interconnect structure when the channel communicates with the environment outside the structure, or escape and be stored in a cavity formed in the interconnect structure, by way of the channel.

Thus, no air bubbles are captured in the blind via, between the metallization material and the second substrate forming the bottom wall of the blind via.

At least one part of the channel extends horizontally between the first substrate and the second substrate, occupying a dedicated space between said two substrates. This space may be formed by a "hollowed out" surface portion of one and/or the other of the two substrates, and/or be formed in the thickness reserved for a sealing interface between the two substrates. Relative to a discharge channel that would pass through the entire thickness of the second substrate, it is possible to electrically contact the front face (second face) and/or the back face (first face) of the first substrate with the front face of the second substrate. Moreover, because the via emerges on a "solid" bottom wall formed by a material (material of the electric contact or the second substrate), i.e. not pierced, it is not necessary to apply a wettability layer to fill the via, for example with an electrically conducting material. Lastly, the structure according to the invention makes it possible to fill the via (e.g. with an electrically conducting material) when the first substrate has already been thinned.

The interconnect structure preferably includes a plurality of blind vias similar to the one described above, i.e. passing through the first substrate and in which one or several channels emerge allowing the air or a fluid to escape from the vias during metallization thereof.

"Substrate" (as well as "first substrate" and "second substrate") refers to a homogenous structure (i.e. including a single layer) or a heterogeneous structure (i.e. including a set of layers). In the case where the first and/or second substrates are heterogeneous, the channel and/or the cavity may be formed in at least one layer of the first substrate and/or at least one layer of the second substrate and/or between a layer of the first substrate and a layer of the second substrate, e.g. in a sealing layer for sealing the first substrate to the second substrate. The first and/or second substrate may be chips, wafers, or any other type of structure.

The first and second substrate of the interconnect structure may be two distinct layers made integral with each other using any sealing and/or gluing technique. Furthermore, after these two substrates have been made integral with each other, it is possible for them to form a single structure not making it possible to distinguish between the two substrates (e.g. in the case of wafer bonding between the two substrates, which, in this case, have the same base material), which can be likened to a single substrate.

Thus, also proposed is an interconnect structure including:
at least one substrate,
at least one blind via formed in the substrate,
at least one electric contact arranged against a bottom wall of the blind via and/or on a face of the substrate at which the blind via emerges.
at least one channel, e.g. formed in the substrate, putting the blind via in communication with an environment outside the interconnect structure and/or with at least one cavity formed in the interconnect structure.

When the electric contact is arranged against the first face and/or against the second face of the first substrate, said electric contact may be arranged on the periphery of the blind via.

The channel and/or the cavity may be formed in the first substrate and/or in the second substrate and/or between the first substrate and the second substrate. When the channel and/or the cavity are formed in the first substrate and/or in the second substrate, scooped out portions, for example etched portions, of the first substrate and/or the second substrate, at the first face of the first substrate and/or at said face of the second substrate (the face opposite the first face of the first substrate) may form the channel and/or the cavity.

The first substrate may be made integral with the second substrate using a sealing interface, e.g. composed of a sealing glue or resin, distinct from the first substrate and the second substrate. In this way, it is possible to form the channel and/or the cavity in the sealing interface, between the first substrate and the second substrate.

In this case, the channel may be formed by at least one space separating at least two portions of the sealing interface.

The sealing interface may include a plurality of disjoined portions of material arranged substantially on the periphery of the blind via.

The interconnect structure may also include at least one second blind via passing through the first substrate and emerging at the first face and at the second face of the first substrate, the channel being able to make said blind via communicate with the outside environment through the second blind via.

In this case, when the first substrate is made integral with the second substrate using a sealing interface distinct from the first substrate and the second substrate, said channel may be formed by at least one space separating a first portion of the sealing interface from a second portion of the sealing interface whereof the pattern is included in, or fitted into, an area defined by a pattern of the first portion of the sealing interface. In such a configuration, the first portion of the sealing interface may form scribe lines of the interconnect structure and the second portion of the sealing interface may form a mechanical reinforcement for an electronic circuit made in the interconnect structure.

The cavity may be formed by at least one space separating a first portion of the sealing interface from a second portion of the sealing interface whereof the pattern is included in, or fitted into, an area defined by a pattern of the first portion of the sealing interface.

The interconnect structure may also include a plurality of blind vias passing through the first substrate and emerging at the first face and at the second face of the first substrate, the channel being able to make the blind vias communicate with each other.

The invention also concerns a method for making an interconnect structure, including at least the following steps:
making at least one via passing through at least a first substrate and emerging at a first face of the first substrate and at a second face, opposite the first face, of the first substrate,
making at least one electric contact against a face of a second substrate and intended to be arranged opposite the via, and/or against the first face and/or against the second face of the first substrate,
making at least one channel intended to put the via in communication with an environment outside the interconnect structure and/or with at least one cavity formed in the interconnect structure,
making the first face of the first substrate integral with said face of the second substrate,
At least part of the channel extends substantially parallel to at least one of said faces of the first and/or second substrates, i.e. parallel to the first face and/or the second face of the first substrate, and/or parallel to said face (the face opposite the first face of the first substrate) of the second substrate.

The securing step may include an attachment or a transfer of one of the substrates on the other with maintenance of said substrates relative to each other.

The channel and/or the cavity may be made in the first substrate and/or in the second substrate and/or between the first substrate and the second substrate.

The first substrate may be made integral with the second substrate using at least one sealing interface distinct from the first substrate and the second substrate.

The channel may be made at least by carrying out the following steps:
depositing a sealing resin-based layer on the first face of the first substrate and/or on said face of the second substrate;
insulating the sealing resin-based layer using a mask comprising at least one pattern corresponding to that of the channel to be made;
developing the sealing resin-based layer, forming, or to form, the sealing interface and the channel.

In one alternative, the channel may be formed at least by carrying out a deposition of a layer of glue on the first face of the first substrate and/or on said face of the second substrate, the layer of glue being structured so as to have at least one pattern corresponding to the sealing interface and the channel to be made.

The channel may be made at least through a step for etching the first and/or second substrate.

The invention also concerns a method for metalizing at least one blind via of an interconnect structure as previously defined, including at least one step for filling the blind via using at least one electrically conducting material.

The filling of the blind via may include carrying out a serigraphy step of the electrically conducting material on the interconnect structure.

BRIEF DESCRIPTION OF THE DRAWINGS

The present invention will be better understood upon reading the description of embodiments provided purely for information and in no way limitingly, in reference to the appended drawings, in which.

Identical, similar, or equivalent parts of the various figures described below bear the same numerical references in order to make the transition from one figure to the next easier.

The different parts shown in the figures are not necessarily shown using a uniform scale, to make the figures more legible.

The different possibilities (alternatives and embodiments) must be understood as not being mutually exclusive and can be combined with each other.

DETAILED DESCRIPTION OF THE INVENTION

Figure 1A:
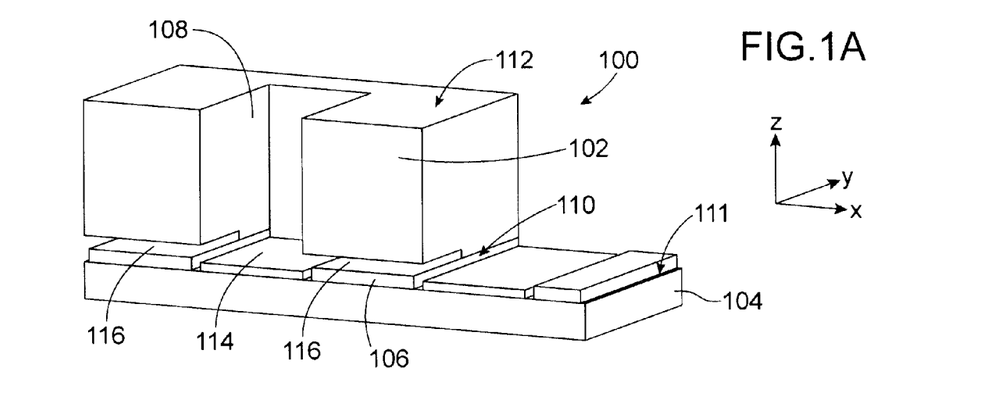
FIGS. 1A to 1C and 2A to 2D partially illustrate an interconnect structure according to different alternatives of a first embodiment.
Figure 1B:
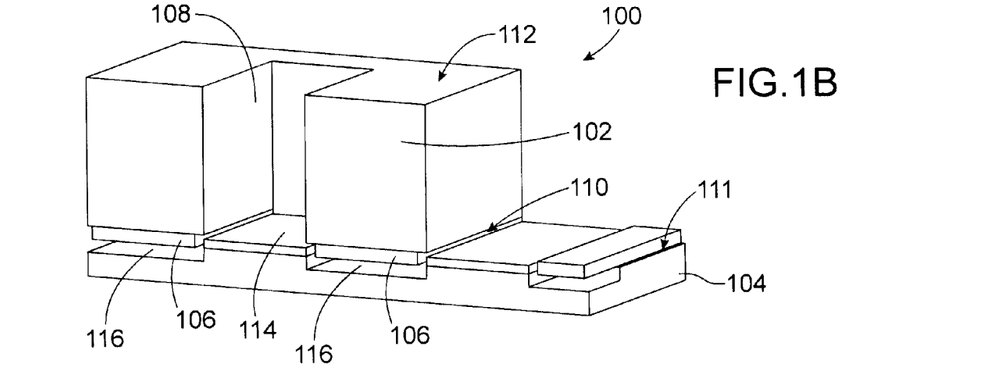
Figure 1C:
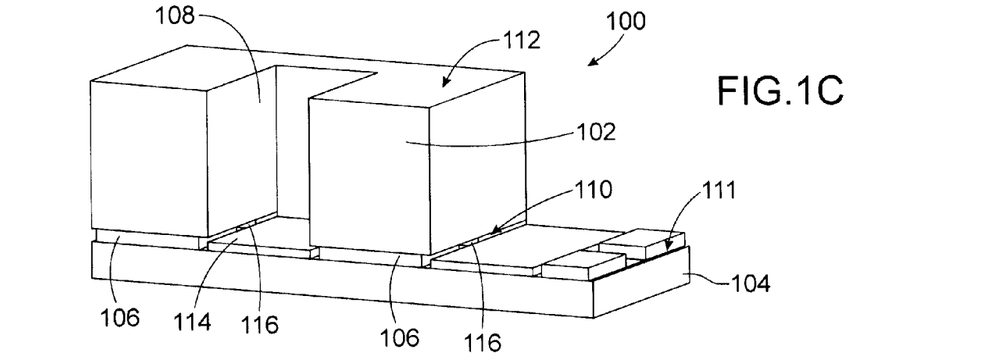

We will first refer to FIGS. 1A to 1C, which partially illustrate an interconnect structure 100 according to different alternatives of a first embodiment.

The interconnect structure 100 includes a first substrate 102 made integral, or secured, with a second substrate 104 by way of a sealing interface 106. The first and second substrates 102 and 104 are for example silicon-based and each have a thickness (dimension along the Z axis shown in FIG. 1A) equal to about 720 μm. The sealing interface 106 is for example glue- or resin-based and for example has a thickness between 3 μm and 20 μm.

The interconnect structure 100 includes a blind via 108 formed through the first substrate 102. The blind via 108 passes through the first substrate 102, i.e. includes an opening at the first face 110 (which is in contact with the sealing interface 106) of the first substrate 102 and at a second face 112, opposite the first face 110, of the first substrate 102. The blind via 108 therefore emerges on a face 111 of the second substrate 104 on which an electric contact 114 is formed, for example composed of an electrically conducting material such as metal (e.g. gold), which forms a bottom wall of the blind via 108, this electric contact 114 being opposite the empty space formed by the blind via 108 in the first substrate 102.

In the examples of FIGS. 1A to 1C, the blind via 108 has a section, in the plane (X,Y), that is parallel to the faces 110 and 112 of the first substrate 102 at which the blind via 108 emerges, with a square shape whereof one side for example has a dimension equal to about 100 μm. The blind via 108 may, however, be made in a different shape, for example cylindrical, and whereof the section in a plane parallel to the plane (X, Y) includes a diameter for example equal to about 100 μm.

Although they are not shown, microelectronic devices (transistors, CMOS sensors, etc.) are formed on the first substrate 102 and/or the second substrate 104 and at least one of these devices is electrically connected to the electric contact 114.

The interconnect structure 100 also includes a channel 116 making it possible to make the inner volume of the blind via 108 communicate with the environment outside the interconnect structure 100 or a cavity formed in the interconnect structure 100.

In the example of FIG. 1A, two channels 116 are formed in the first substrate 102, at its first face 110. These channels 116 form empty spaces etched in the first substrate 102, at the first face 110. The channels 116 therefore extend horizontally between the first substrate 102 and the second substrate 104. Because the channels 116 are formed by "scooped out" portions on the surface of the first substrate, these channels 116 extend in particular between the first substrate 102 and a portion of the sealing interface 106.

Thus, when a metallization material is introduced into the blind via 108, e.g. by way of a serigraphy doctor blade, the metallization material flows in the blind via 108 and the air present in the empty space of the blind via 108, under the metallization material, can escape through these channels 116 to be discharged either towards the outside of the interconnect structure, or towards a cavity in which the air is intended to be stored.

In the alternative embodiment shown in FIG. 1B, the two channels 116 are formed in the second substrate 104, at the face 111 that is in contact with the sealing interface 106. These channels 116 form empty spaces etched in the second substrate 104, forming air circulation channels playing a role similar to that described above for the channels 116 of the alternative shown in FIG. 1A. The channels 116 therefore extend horizontally between the first substrate 102 and the second substrate 104, and more precisely here between the second substrate 104 and a portion of the sealing interface 106. A portion of the channels 116 in the form of a zigzag makes the horizontal portion of the channels communicate with the via 108.

In the alternative embodiment shown in FIG. 1C, the two channels 116 are formed between the first substrate 102 and the second substrate 104, i.e. in the sealing interface 106. Thus, these channels 116 form empty spaces between the distinct portions of the sealing interface 106 making it possible to put the inside of the blind via 108 in communication with the outside environment and/or a cavity formed in the interconnect structure 100. Such an alternative in particular has the advantage of not requiring that an etching step be carried out on one or several substrates 102 and 104. Here again, the channels 116 extend horizontally between the first substrate 102 and the second substrate 104.

The widths of the channels 116 may for example be between several micrometers and several hundreds of micrometers. The dimensions of the channels may be chosen for example as a function of the viscosity of the material intended to fill the blind vias, for example so that said metallization material does not flow in the channels.

It is possible to combine the alternatives previously described. Thus, the channels 116 may be made in the first substrate 102 and/or in the second substrate 104 and/or in the sealing interface 106.

FIGS. 2A to 2D partially illustrate the interconnect structure 100 according to different alternatives of the first embodiment.

In these FIGS. 2A to 2D, the blind via 108 of the interconnect structure 100 is filled with a metallization material 118 making it possible to form an electric interconnect between at least two electric contacts formed on the first substrate 102 and/or on the second substrate 104, and/or to form an electric contact pick-up formed on the first substrate 102 and/or on the second substrate 104.

Figure 2A:
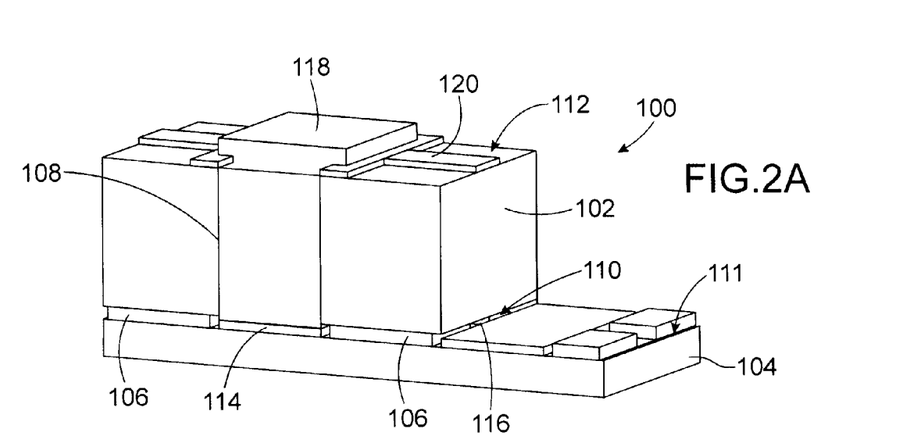

In the example of FIG. 2A, the metallization 118 electrically connects a first electric contact 114, similar to the electric contact 114 shown in FIGS. 1A to 1C, to a second electric contact 120 formed on the second face 112 of the first substrate 102, on the periphery of the blind via 108. The metallization material 118 may cover the second electric contact 120, thereby increasing the electric contact area at the second face 112, which makes it possible to reduce the electric resistance of said contact.

Figure 2B:
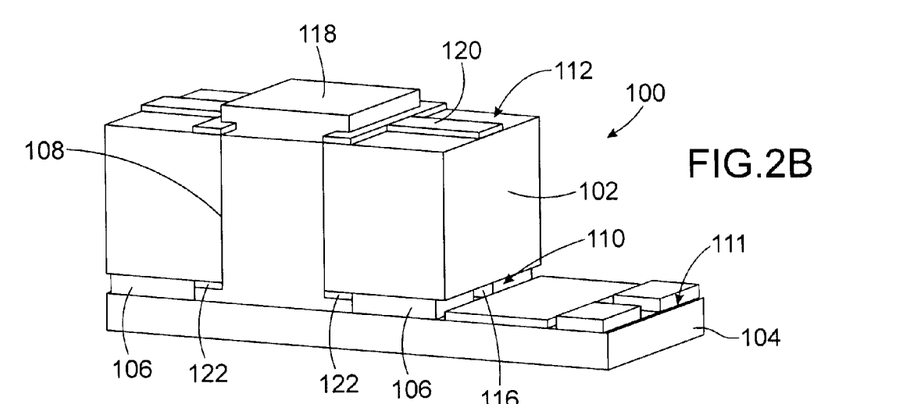

In the example of FIG. 2B, the interconnect structure 100 does not include the first electric contact 114, the metallization 118 electrically connecting the second electric contact 120 to a third electric contact 122 formed against the first face 110 of the first substrate 102, on the periphery of the blind via 108.

Figure 2C:
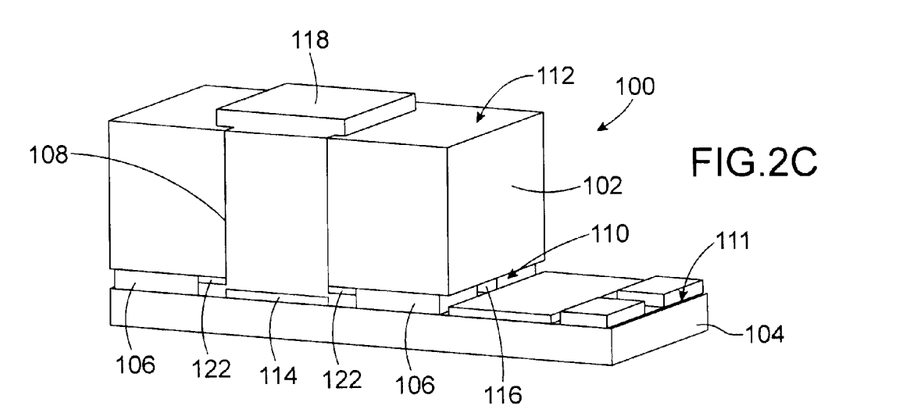

In the example of FIG. 2C, the interconnect structure 100 does not include the second electric contact 120, the metallization 118 electrically connecting the first electric contact 114 to the third electric contact 122. In this alternative, the metallization 118 therefore forms an electric access to the contacts 114 and 122 from the second face 112 of the first substrate 102.

Figure 2D:
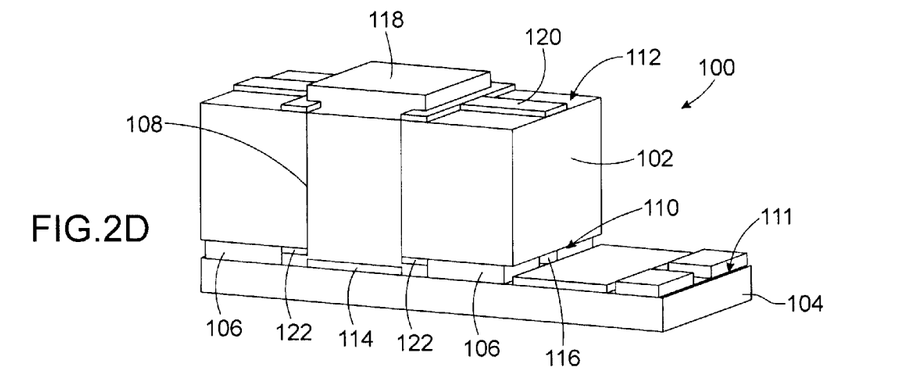

Lastly, in the example of FIG. 2D, the metallization 118 electrically connects the first, second and third electric contacts 114, 120 and 122 together.

In the alternatives shown in FIGS. 2A to 2D, the metallization 118 electrically connects at least two electric contacts formed at the blind via 108. However, it is possible for only one of the electric contacts 114, 120 or 122 to be formed at the blind via 108. In this case, the metallization 118 forms an electric access to that contact from one of the faces of the interconnect structure 100.

Thus, in the examples described in connection with the preceding FIGS. 1A to 1C and 2A to 2D, the blind via 108 is intended to receive a metallization material making it possible to form an electric connection with at least one electric contact formed on the first substrate 102 and/or at least one electric contact formed on the second substrate 104. The horizontal position of the channels 116 in particular makes it possible not to have a flow of metallization material 118 in the channels 116.

Figure 3:
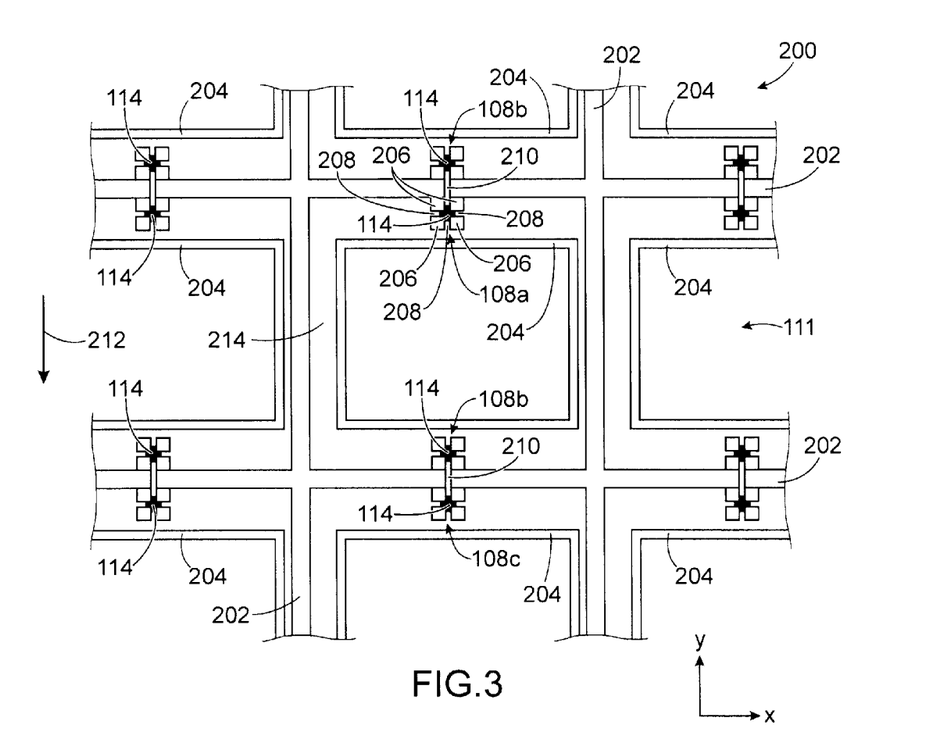
FIG. 3 to 5 illustrate partial cross-sectional views of an interconnect structure according to second, third, and fourth embodiments.

We will now refer to FIG. 3, which partially illustrates a cross-sectional view of an interconnect structure 200 according to a second embodiment.

The interconnect structure 200 is formed according to the same alternative as the interconnect structure 100 shown in FIG. 1C.

Thus, the interconnect structure 200 includes the first substrate 102 made integral, or secured, with the second substrate 104 via the sealing interface 106. Blind vias 108 are formed through the first substrate 102 and emerge in channels 116 formed in the sealing interface 106.

The view shown in FIG. 3 corresponds to a cross-sectional view in the plane of the sealing interface 106 that is parallel to the plane (X, Y). Thus, the face 111 of the second substrate 104, the sealing interface 106, and the electric contacts 114 are in particular shown in FIG. 3.

The interconnect structure 200 includes a plurality of electronic circuits, not shown in FIG. 3, for example made on the first substrate 102. The sealing interface 106 makes it possible to form the mechanical connection between the first substrate 102 and the second substrate 104.

Moreover, the particular pattern of the sealing interface 106 shown in FIG. 3 makes it possible to perform other functions.

Thus, first portions 202 of the sealing interface 106 made in the form of continuous strips cross each other perpendicularly, forming a crisscross pattern whereof the squares define the locations of the different electronic circuits of the interconnect structure 200. This crisscross forms scribe lines, or cleaving paths, for the individual cutting of the electronic circuits formed in the interconnect structure 200 and make it possible, when the substrates 102 and 104 are cut out, to avoid damaging the zones of the substrates on which the electronic circuits are made. Second portions 204 of the sealing interface 106 form rectangular patterns defining the active portions of the electronic circuits, said second portions 204 being included in the square patterns formed by the first portions 202 of the sealing interface 106. These second portions 204 also serve as mechanical reinforcements for the active portions of the electronic circuits.

In the embodiment shown in FIG. 3, each electric contact 114 is surrounded by a plurality of portions 206 of material of the sealing interface 106. These portions 206 are square here and spaced away from each other so that spaces 208 are present between said portions 206. Thus, given that the blind vias 108 are formed through the first substrate and opposite the electric contacts 114, each of the spaces 208 forms a portion of an air circulation channel between the blind via 108 found overhanging one of the electric contacts 114 and a space 214 formed between one of the patterns formed by the crisscross of the first portions 202 and one of the second portions 204 of the sealing interface 106. Spaces 210 are also formed through the first portions 202, which are parallel to the X axis in order to make the blind vias 108 formed on either side of a strip that is part of the first portions 202 of the sealing interface 106 communicate.

The metallization of blind vias 108a, 108b and 108c of the interconnect structure 200 will now be described. This metallization is done here by serigraphy. Thus, the metallization material is spread using a serigraphy doctor blade in the direction of the arrow 212 shown in FIG. 3.

The metallization material is first introduced into the blind via 108a. The air present in the blind via 108a is then discharged by first going through the spaces 208 formed between the portions 206 found on the periphery of said via, then the space 214 formed between the first portions 202 and one of the second portions 204 of the sealing interface 106. The air then passes through the spaces 208 formed between the portions 206 located on the periphery of the blind via 108b, and then is discharged towards the outside through the blind via 108b.

When the serigraphy doctor blade arrives at the blind via 108b, the metallization material is introduced into the blind via 108b. The air present in the blind via 108b is then discharged to the outside through the blind via 108c, the air going from the via 108b to the via 108c through the space 210 connecting the vias 108b and 108c.

The metallization method described above for the three blind vias 108a to 108c is applied simultaneously to all of the vias formed in the interconnect structure 200 found on a same axis parallel to the X axis. Thus, the air circulation channels formed in the interconnect structure 200 allow the pressure generated when the metallization material is introduced into the blind vias to balance with the blind vias arranged downstream in the direction of the serigraphy.

Figure 4:
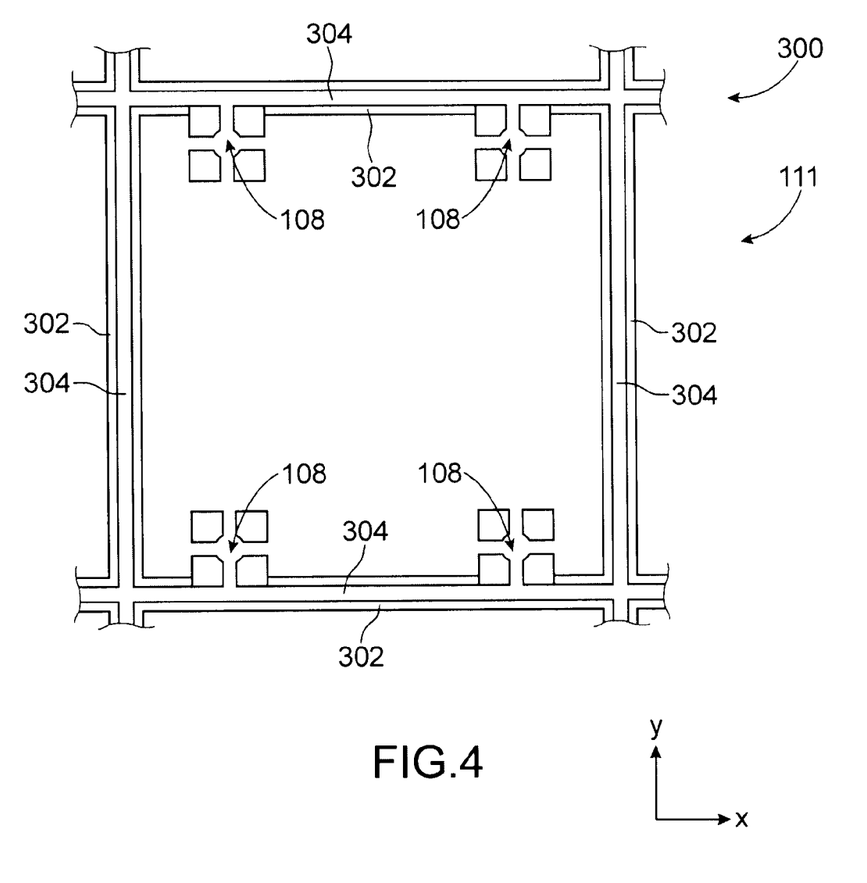

We will now refer to FIG. 4, which partially illustrates a cross-sectional view of an interconnect structure 300 according to a third embodiment.

Relative to the interconnect structure 200 previously described, portions 302 of the sealing interface 106 form channels 304 extending over the entire length and the entire width of the substrates 102 and 104. Each of the blind vias 108 is in communication with one of these channels 304 through which, when the metallization material is introduced into the blind vias 108, the air can escape. At the end of these channels 304, it is possible to provide blind vias, not necessarily including an electric contact, that will also be plugged by the metallization material and that will be used to close the air flow between the channels 304 and the environment outside the interconnect structure 300. In the example of FIG. 4, the blind vias 108 communicate with the channels 304, but also with the inside of the pattern defined by the rectangular portion 302, and therefore also communicate with each other. In one alternative, it is possible for the blind vias 108 not to communicate with the inside of the pattern defined by the rectangular portion 302, but only communicate with the channels 304, the discharge of the air only being done in that case through the scribe lines.

Figure 5:
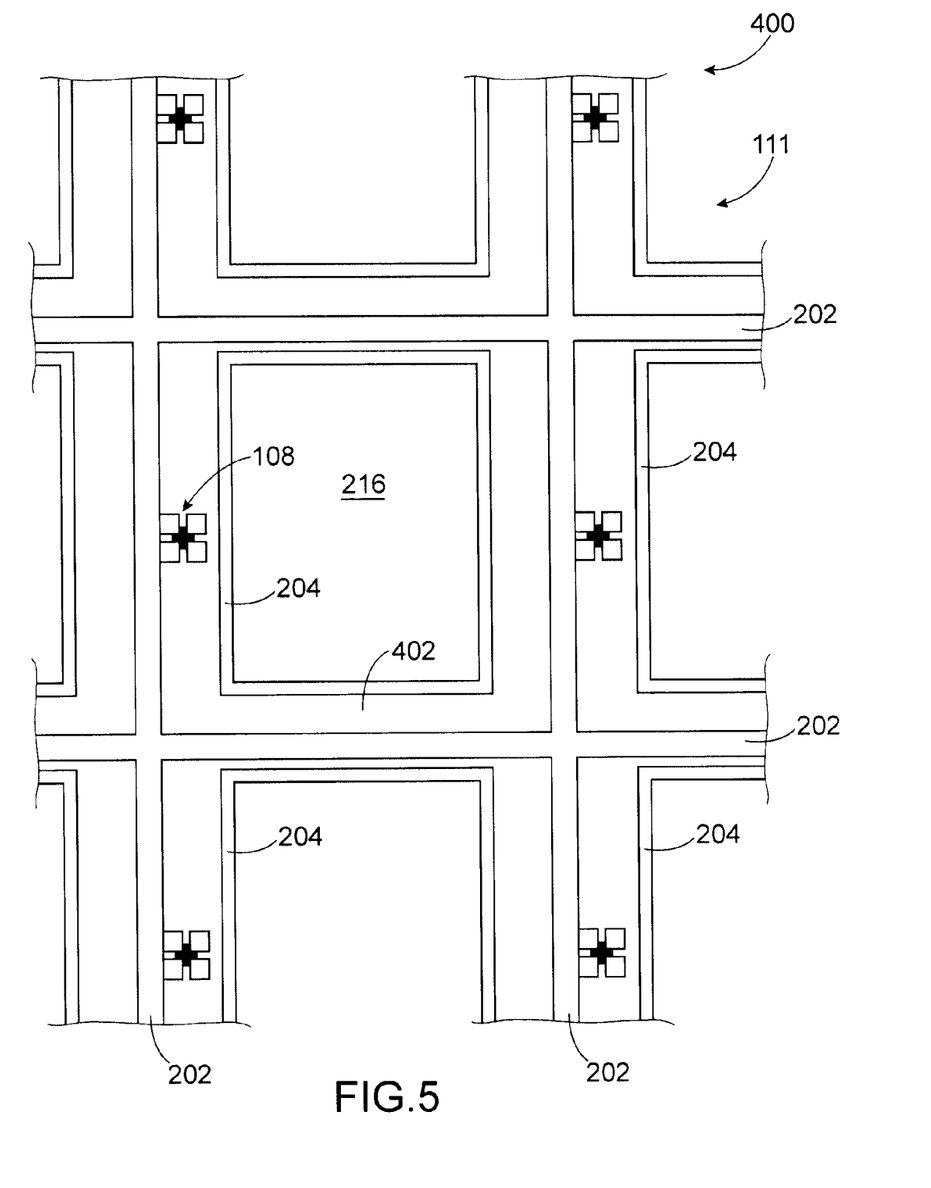

We will now refer to FIG. 5, which partially illustrates a cross-sectional view of an interconnect structure 400 according to a fourth embodiment.

Similarly to the interconnect structure 200 previously described, the first portions 202 of the sealing interface 106 form a crisscross in which second portions 204 of the sealing interface 106 are arranged for example including rectangular patterns defining the active portion of the electronic circuits of the interconnect structure 400.

Unlike the interconnect structure 200, a single blind via 108 is in communication with the space 402 formed between one of the second portions 204 of the sealing interface 106 and a square formed by the crisscross of the first portions 202 of the sealing interface 106. Thus, this space 402 forms a cavity in which, when the metallization material is introduced into the blind via 108, the air is captured. In this configuration, the volume of the cavity 402, the compressibility of the fluid located in the blind vias 108 before serigraphy (e.g. of the gas or air type), and rheological properties of the metallization material are taken into account in order to obtain an optimal filing of the blind vias 108 using the metallization material.

In one alternative embodiment of the interconnect structure 400, it is possible for the second portions 204 of the sealing interface 106 not to form a closed-contour pattern, but for an opening to be formed in the pattern of the second portions 204 of the sealing interface 106. Thus, the space 216 found inside the second portion 214 of the sealing interface communicates with the space 402, thereby increasing the total volume of the cavity in which the air or fluid coming from the blind via 108 is captured.

In another alternative, it is also possible for the scribe lines 202 to include openings in order to make the different cavities 402 communicate with each other, the air thus being able to escape, during serigraphy, through the blind vias 108 arranged downstream of the blind vias filling with metallization material, in the direction of the serigraphy.

Reference will now be made to FIGS. 6A to 6D, which illustrate the steps of a method for making the interconnect structure 100, done here according to the alternative illustrated in FIG. 1C, i.e. whereof the channels are made in the sealing interface 106.

Figure 6A:
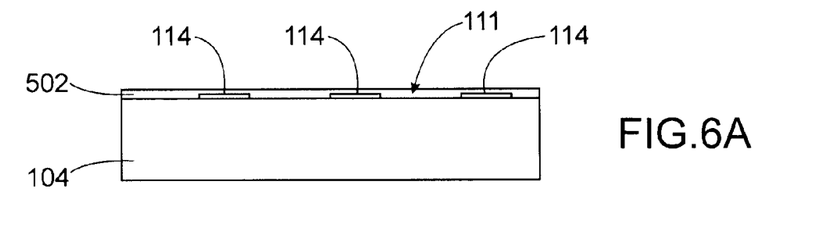
FIGS. 6A to 6D illustrate steps of a method for making the interconnect structure according to the first embodiment.

As shown in FIG. 6A, the second substrate 104, which includes the electric contacts 114 made on its face 111, is covered with a sealing resin-based layer 502.

This layer 502, for example deposited with a spin coater, also covers the electric contacts 114.

Figure 6B:
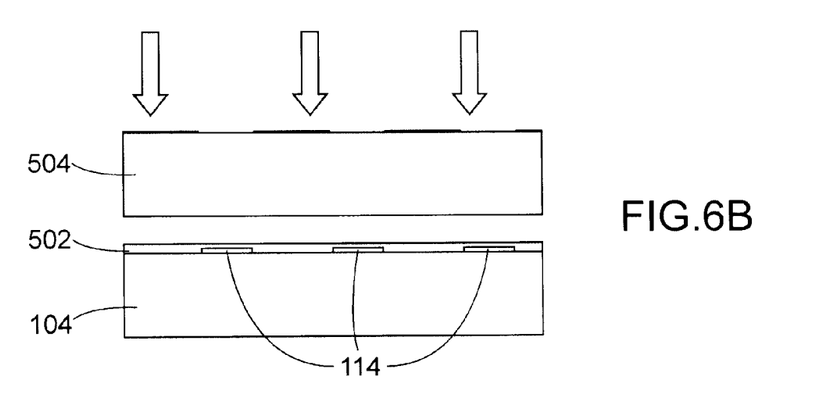

The layer 502 is then insulated using a lithography mask 504 whereof the pattern corresponds to that of the sealing interface 106 to be made (FIG. 6B). This pattern also includes channels and possibly cavities intended to be made in the sealing interface 106. The insulated layer 502 is then developed, for example by an etching solution adapted to the resin of the layer 502, thereby forming the sealing interface 106.

Figure 6C:
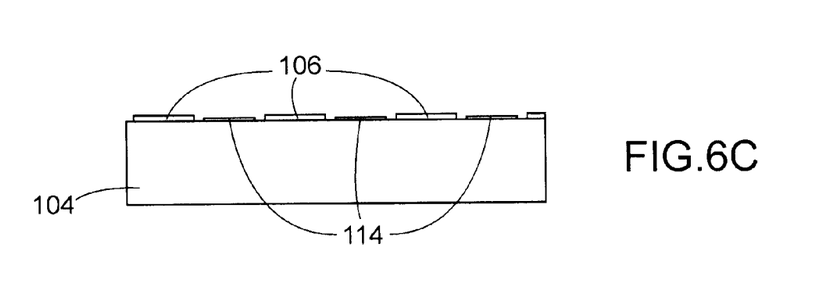
Figure 6D:
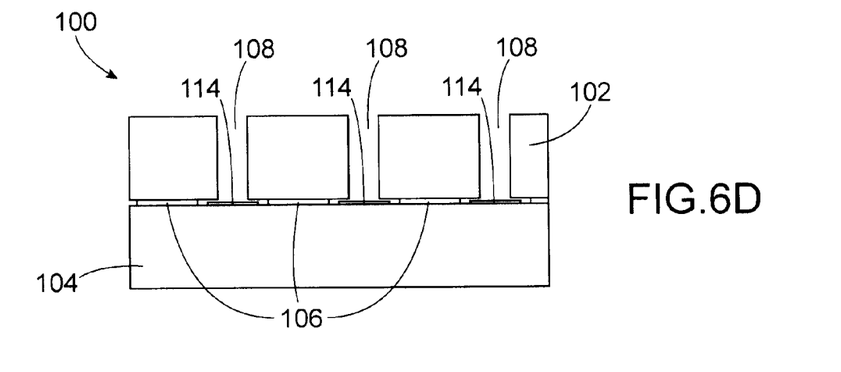

Lastly, the first substrate 102, in which the blind vias 108 are made beforehand, is attached and sealed to the second substrate 104, forming the interconnect structure 100. The blind vias 108 are thus ready to be metalized, for example by carrying out serigraphy or any other suitable metallization method, the air circulation channels made in the sealing interface 106 allowing the evacuation of the air, initially present in the blind vias 108, towards the outside or the storage of the air in a cavity.

In one alternative embodiment, it is possible to make the sealing interface 106 by depositing a layer of glue on the first face of the first substrate 102 and/or on the face 111 of the second substrate 104. The layer of glue is structured so as to have at least one pattern corresponding to the sealing interface and the channel to be made.

The invention claimed is:

1. An interconnect structure including:
   at least one first substrate, whereof at least one first face is made integral with at least one face of at least one second substrate,
   at least one blind via passing through the first substrate and emerging at the first face of the first substrate and at a second face, opposite the first face, of the first substrate,
   at least one electric contact arranged against at least one of said face of the second substrate and the first face of the first substrate and the second face of the first substrate,
   at least one empty channel putting the blind via in communication, via an air space, with at least one of an environment outside the interconnect structure and at least one cavity formed in the interconnect structure, and whereof at least a portion extends substantially parallel to at least one of said faces of the first and second substrate.

2. The interconnect structure according to claim 1, wherein, the electric contact is arranged against the first face or against the second face of the first substrate, and said electric contact is arranged on the periphery of the blind via.

3. The interconnect structure according to claim 1, wherein the channel is formed in at least one of the first substrate, the second substrate, and between the first substrate and the second substrate.

4. The interconnect structure according to claim 1, wherein the first substrate is made integral with the second substrate using a sealing interface distinct from the first substrate and the second substrate.

5. The interconnect structure according to claim 4, wherein the channel is formed by at least one space separating at least two portions of the sealing interface.

6. The interconnect structure according to claim 4, wherein the sealing interface includes a plurality of disjoined portions of material arranged substantially on the periphery of the blind via.

7. The interconnect structure according to claim 1, also including at least one second blind via passing through the first substrate and emerging at the first face and at the second face of the first substrate, the channel being able to make said blind via communicate with the outside environment through the second blind via.

8. The interconnect structure according to claim 7, wherein, when the first substrate is made integral with the second substrate using a sealing interface distinct from the first substrate and the second substrate, said channel is formed by at least one space separating a first portion of the sealing interface from a second portion of the sealing interface whereof the pattern is included in an area defined by a pattern of the first portion of the sealing interface.

9. The interconnect structure according to claim 1, wherein the cavity is formed by at least one space separating a first portion of the sealing interface from a second portion of the sealing interface whereof the pattern is included in an area defined by a pattern of the first portion of the sealing interface.

10. The interconnect structure according to claim 1, also comprising a plurality of blind vias passing through the first substrate and emerging at the first face and at the second face of the first substrate, the channel being able to make the blind vias communicate with each other.

11. The interconnect structure according to claim 1, wherein the at least one electric contact is arranged against said face of the second substrate and opposite the blind via.

* * * * *